United States Patent [19]
Mutoh

[11] Patent Number: 4,860,326
[45] Date of Patent: Aug. 22, 1989

[54] SOLID-STATE IMAGE PICKUP DEVICE

[75] Inventor: Hideki Mutoh, Kanagawa, Japan

[73] Assignee: Fuji Photo Film Co., Ltd., Kanagawa, Japan

[21] Appl. No.: 269,284

[22] Filed: Nov. 10, 1988

[30] Foreign Application Priority Data

Nov. 10, 1987 [JP] Japan .................. 62-281991

[51] Int. Cl.$^4$ .................. G11C 19/28; H01L 29/78; H03K 3/42; H04N 3/14
[52] U.S. Cl. .................. 377/58; 357/24; 307/311; 358/213.19; 358/213.24
[58] Field of Search .............. 357/24, 30; 377/57–63; 307/311; 358/213.19, 213.24, 213.26

[56] References Cited

U.S. PATENT DOCUMENTS

| | | | |
|---|---|---|---|
| 4,032,976 | 6/1977 | Levine | 357/24 LR |
| 4,322,753 | 3/1982 | Ishihara | 357/24 LR |
| 4,656,519 | 4/1987 | Savoye | 357/24 LR |
| 4,783,702 | 11/1988 | Sone et al. | 358/213.19 |
| 4,794,279 | 12/1988 | Yamamura et al. | 358/213.24 |

Primary Examiner—Gene M. Munson
Attorney, Agent, or Firm—Sughrue, Mion, Zinn, Macpeak & Seas

[57] ABSTRACT

A solid-state image pickup device equipped with a high-speed electronic shutter function is comprised of photoelectric transducer elements arranged in matrix form, vertical transfer routes, a horizontal transfer route, and a vertical control circuit. The vertical control circuit simultaneously shifts signal charges from the photoelectric transducer elements to the vertical transfer routes, shifts a horizontal one-row portion of the signal charges in the vertical transfer routes to the horizontal transfer route, and also alternatively selects and vertically transfers a next one-row portion of the signal charges to the horizontal transfer route. Further, the image pickup device features an exhaust drain. A vertical charge-coupled device forms the vertical transfer routes; similarly, a horizontal charge-coupled device forms the horizontal transfer route.

6 Claims, 2 Drawing Sheets

SOLID-STATE IMAGE PICKUP DEVICE

FIELD OF THE INVENTION

The present invention relates to a solid-state image pickup device, and more particularly, to an interline type CCD solid-state image pickup device equipped with a high-speed electronic shutter function.

BACKGROUND OF THE INVENTION

One of the functions of the solid-state image pickup device of recent interest is the electronic shutter. The electronic shutter function makes possible the acquisition of a precise image of an object which is moving at high speed by dumping electrical charge accumulated within the device once during a vertical blanking period and subsequently receiving light again until the normal read time.

On the other hand, a device consisting of photoelectric transducer elements arranged in matrix form, vertical transfer routes, horizontal transfer routes, and a transfer control part is well known as a solid-state image pickup device. Such an image pickup device may be constructed as, for example, an interline transfer type CCD. In that case, the vertical and horizontal transfer routes consist of shift registers which supply transfer pulses to the CCD transfer electrodes.

Construction of a high speed shutter by adding the electronic shutter function to an interline transfer type image pickup device yields poor results. The quantity of signal photoelectrically converted is small in comparison to the smear quantity generated in the device, owing to the extremely short exposure time of the high-speed shutter. As a result, obtaining an image of practical utility is not possible.

Furthermore, another difficulty exists. Although the conventional interline transfer type device can accumulate signal charged in a frame and can read a frame image in the interlace mode, it is well known that adding the electronic shutter function to such a device makes reading the frame image impossible. That is, when reading a frame image in the interlace mode with the conventional device, the photoelectric transducer elements assigned to a B field are receiving light and accumulating electrical charges without interruption even during the period in which an A field signal is transferred to and within the vertical CCD. In this way, the photoelectric transducer elements are continually performing photoelectric conversion and charge accumulation except while electrical charges are transferred to the vertical CCD. Therefore, if a specific exposure period is introduced into a system where the electronic shutter function is added to an interline type image pickup device reading signals in the interlace mode, a slippage of 1/60 second occurs between an A field image and a B field image. Thus, as the shutter time is diminished for a moving object, a desirable frame image cannot be obtained. In other words, when the electronic shutter function is added to the interline type CCD image pickup device, the frame image cannot be read. As a result, when a solid-state image pickup device supplemented by the electronic shutter function is applied to an electronic still camera, only a field image can be obtained, yielding the particular disadvantage of a reduction in the resolution.

It should be mentioned that the frame interline type (FIT) CCD is known to reduce smears by transferring the signal charges at high speed in the vertical direction, thus enabling a high speed shutter operation. However, the disadvantage of the device is that it requires a charge accumulating part in addition to the light receiving part, resulting in an increased chip area. Further, even with the FIT type device, a frame image cannot be obtained in the electronic shutter mode.

SUMMARY OF THE INVENTION

Accordingly, it is an object of the present invention to provide a solid-state image pickup device implementing a high-speed shutter operation by using an interline type CCD image pickup device with an added electronic shutter function.

It is another object of the present invention to obtain a frame image in the electronic shutter mode.

The above mentioned objects of the present invention can be accomplished by a solid-state image pickup device which includes photoelectric transducer elements arranged in matrix form, vertical transfer routes, and a horizontal transfer route. The solid-state image pickup device is further characterized by a vertical transfer control part for simultaneously shifting the signal charges generated in the photoelectric transducer elements to the vertical transfer routes, then, after shifting the signals for a horizontal one-row portion to the vertical transfer routes, for vertically transferring to the horizontal transfer route, and for selecting alternatively next one-row portions of the signals.

That is, in the solid-state image pickup device of the present invention, after signals of the photoelectric transducer elements are simultaneously field-shifted to the vertical transfer routes, signals for the next and later stages remain where they are without being transferred vertically until the signals for a one-row portion along the horizontal direction are read from the horizontal transfer route starting at the side nearer to the output terminal. Subsequent to the reading of a one-row portion from the horizontal transfer route, signals of the next one-row portion, selected alternatively, are transferred at high speed in the vertical direction to be read to the horizontal transfer route. With this arrangement, except for the period immediately after they are field-shifted in which they remain in the vertical transfer routes, the respective signal charges which are field-shifted simultaneously to the vertical transfer routes are given a shortened hold time in the vertical transfer routes. This results in a reduction in the occurrence of smears. On the other hand, immediately after the field-shift while they remain in the vertical transfer routes, mixing of photoelectrically induced charges is limited only to those from the corresponding picture elements, so that even if an intense light is incident upon a picture element with large original signal quantity, the resulting smear is not noticeable. In contrast, noticeable effects occur when a large photoelectrically induced charge from another picture element is mixed in a transfer cell with a small signal quantity being shifted to a vertical transfer route. However, as noted earlier, in the present invention the vertical transfer is performed at a high speed, so that the influence of other picture elements during the transfer can be avoided, thus preventing the generation of smears.

The above and other objects, features and advantages of the present invention will become apparent from the following detailed description taken with the accompanying diagrams.

DETAILED DESCRIPTION OF THE INVENTION

Figure 1:
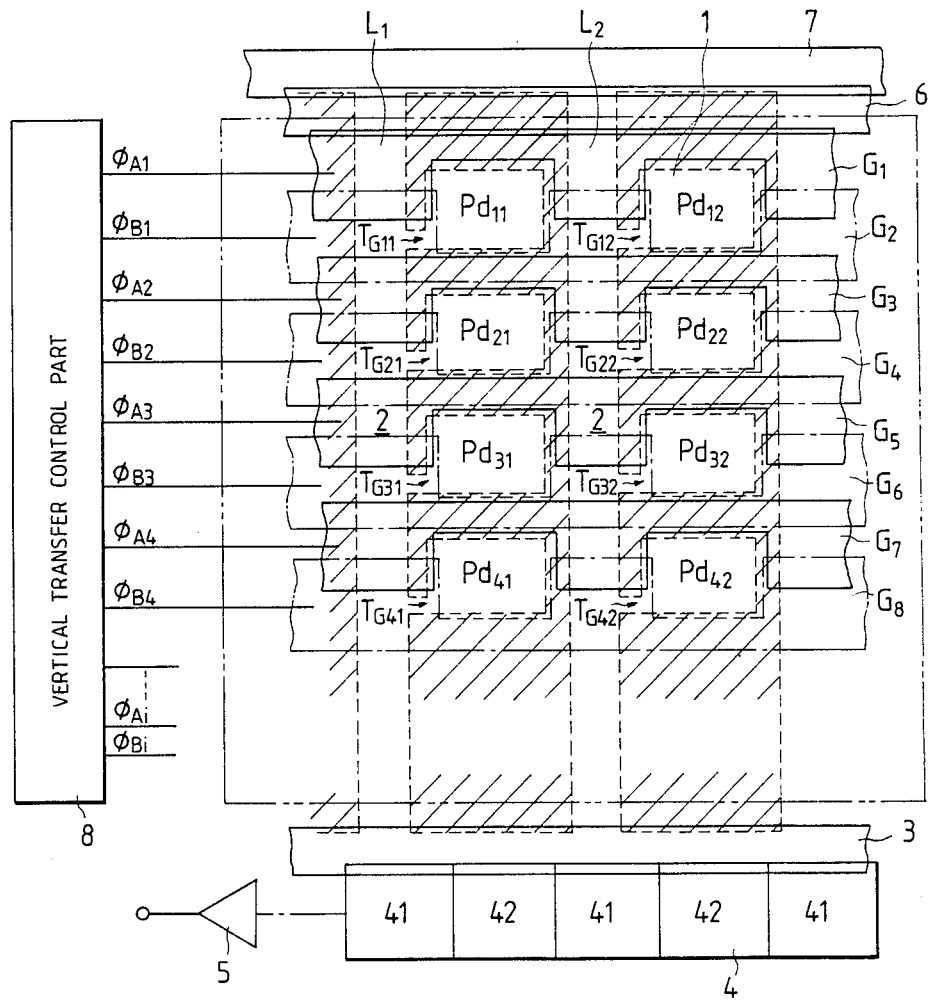
FIG. 1 is a block diagram for the solid-sate image pickup device in accordance with a first embodiment of the present invention.

Referring to the drawings, an embodiment of the present invention will now be described in detail.

An embodiment shown in FIG. 1 schematically illustrates a portion of the solid-state image pickup device in accordance with the present invention. Within the frame surrounded by the line with alternate long and two short dashes, the Figure shows photoelectric transducer elements 1 arranged in matrix form and a vertical CCD 2 for vertically transferring signal charges of the respective vertical columns of photoelectric transducer elements 1.

At one end of the vertical CCD 2, a horizontal CCD 4 acts as a horizontal transfer route for transferring the signal charge in the horizontal direction through a gate 3. The signal charge for each horizontal row shifted to the horizontal CCD 4 is driven in two phases by the transfer electrodes 41 and 42, and is read out through a buffer amplifier. On the other hand, at the end of vertical CCD 2 which is opposite to the horizontal CCD 4, an exhaust drain 7 extends along the horizontal direction through a gate 6.

Photodiodes $P_{d11}, P_{d12}, \ldots, P_{d21}, P_{d22}, \ldots$, etc., which constitute the photoelectric transducer elements 1, are formed by the p-n junction on the surface portion of a semiconductor substrate. Between the respective photodiodes there are formed a plurality of vertical transfer routes $L_1, L_2, \ldots$, etc. for transferring signal charges in the vertical direction, and the portion (hatched portion surrounded by the broken line in the Figure) excluding the photodiode group and the vertical transfer routes $L_1, L_2, \ldots$, etc. serves as the channel stopping region.

On the surface of the vertical transfer routes $L_1, L_2, \ldots$, etc., a vertical CCD is formed by disposing in parallel a plurality of transfer electrodes $G_1, G_2, G_3, G_4, \ldots$, etc. extending in the horizontal direction and made of a polysilicon layer. The transfer electrodes $G_1, G_2, G_3, G_4, \ldots$, etc. are connected to a vertical transfer control part 8 and are applied with clock signals $\phi_{A1}, \phi_{B1}, \phi_{A2}, \phi_{B2}, \ldots, \phi_{Ai}$ and $\phi_{Bi}$, based on the prescribed timings as will be described later. Corresponding to the row of photodiodes $P_{d11}, P_{d12}, \ldots$, etc. are two transfer electrodes $G_1$ and $G_2$. Corresponding to the row of photodiodes $P_{d21}, P_{d22}, \ldots$, etc. are two transfer electrodes $G_3$ and $G_4$. A similar construction applies to other photodiodes and transfer electrodes. Then, by forming potential wells in the vertical transfer routes $L_1, L_2, \ldots$, etc. in response to the voltage variations in the clock signals $\phi_{A1}, \phi_{B1}, \phi_{A2}, \phi_{B2}, \ldots, \phi_{Ai}$ and $\phi_{Bi}$, signal charges generated in the respective photodiodes are transferred toward the output terminal In FIG. 1, the photodiodes and the vertical transfer routes $L_1, L_2, \ldots$, etc. are respectively connected via transfer gates $T_{G11}, T_{G12}, \ldots, T_{G21}, T_{G22}, \ldots$, etc.

Figure 2:
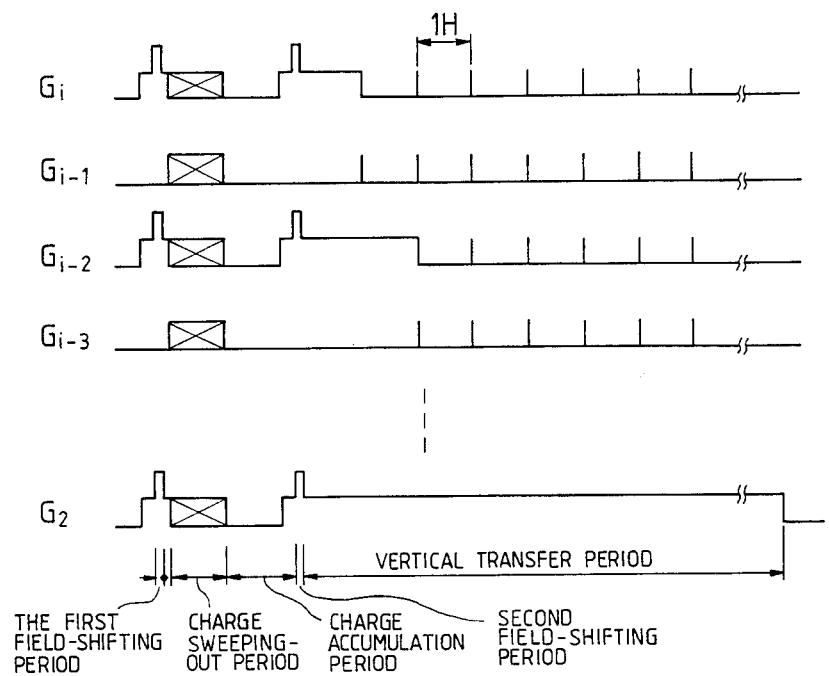
FIG. 2 is a timing diagram illustrating the operation of the device.

Next, by referring to the timing diagram shown in FIG. 2, the operation of the solid-state image pickup device of the present invention will be described in detail.

First, when the electronic shutter is operated, a voltage which is higher than the voltage used during the signal transfer is applied to the transfer electrodes $G_2, G_4, G_6, \ldots$, etc. which contain the transfer gates $T_{G11}, T_{G12}, \ldots, T_{G21}, T_{G22}, \ldots$, etc. Thus, the charges accumulated in the photodiodes $P_{d11}, P_{d12}, \ldots, P_{d21}, P_{d22}, \ldots$, etc. are shifted to the vertical transfer routes $L_1, L_2, \ldots$, etc. Then, by driving the transfer electrodes $G_1, G_2, G_3, \ldots, G_{2i}$, the accumulated charges are transferred at high speed in the direction opposite to that of the ordinary image output, namely, in the upward direction of the Figure for the present embodiment, and are simultaneously swept out through the exhaust drain 7 within a predetermined charge sweepout period. On the other hand, accumulation of the normal signal charges in the photodiodes beings when the sweep-out period for the unwanted charges has elapsed. The accumulation period of the signal charges is set in response to the release time of the shutter, completing the accumulation after the elapse of a predetermined time. Analogous to the case of the unwanted charges described above, these signal charges are shifted to the vertical transfer routes $L_1, L_2, \ldots$, etc. by the application of a high voltage to the transfer electrodes $G_2, G_4, G_6, \ldots$, etc. which contain the transfer gates $T_{G11}, T_{G12}, \ldots, T_{G21}, T_{G22}, \ldots$, etc. Here, the signal charges shifted to the vertical transfer routes $L_1, L_2, \ldots$, etc. are transferred at high speed in the downward direction, in contrast to the case of the unwanted charges above. In the solid-state image pickup device of the present invention, the signal for a horizontal one-row portion which is nearest to the output terminal is transferred to the horizontal CCD 4 by driving the transfer electrode $G_{2i}$. During this period, other signal charges remain as they are without being transferred vertically. When the signal charge for the first row is read from the horizontal CCD 4, the signal charge for the next stage is transferred vertically by driving the transfer electrodes $G_{2(i-1)}, G_{2i-1}$, and $G_{2i}$. In a similar manner, the signal charge of the third and subsequent rows is transferred vertically by n-phase driving of the transfer electrodes when the signal charge for the preceding stage is read out. In this fashion, the signal charges of all the photodiodes are read out.

Figure 3:
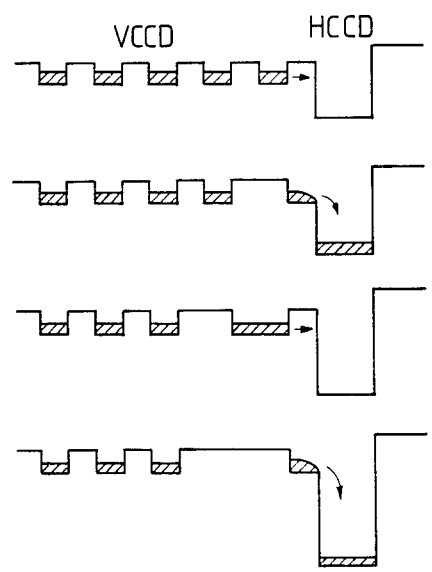
FIG. 3 is a potential profile diagram.

FIG. 3 illustrates the potential profiles for the above-mentioned process. The signal charges field-shifted to each transfer cell of the vertical CCD 2 are read by the horizontal CCD 4, starting with the charges in the wells nearest to the horizontal CCD 4. The electrical charges of the transfer cells other than those in the stage currently being read are maintained without being transferred.

As described above, according to the solid-state image pickup device of the present invention, every time the accumulated signal charges in the photodiodes are read from the horizontal CCD one row at a time, vertical transfer of the signal charges for the next row is executed at high speed. Mixing optical signals from other picture elements during the signal charge transfer can be avoided, even without the use of a charge accumulating part, so that it is possible to reduce the occurrence of smears.

Therefore, owing to the reduction in the number of smears and the installment of the exhaust drain, a high speed shutter operating becomes feasible. Moreover, since the vertical transfer of the signal charges is executed one row at a time, a frame image can be obtained through the frame accumulation of the charges even when operated in the electronic shutter mode, and a high resolution image can be obtained when the solid-state image pickup device is applied in particular to an electronic still camera.

Various modifications will become possible for those skilled in the art after receiving the teachings of the present disclosure without departing from the scope thereof.

What is claimed is:

1. A solid-state image pickup device comprising photoelectric transducer elements arranged in matrix form, vertical transfer routes, and a horizontal transfer route, said solid-state image pickup device further comprising:

vertical transfer control means for simultaneously shifting signal charges generated in said photoelectric transducer elements to said vertical transfer routes, for shifting a horizontal one-row portion of said vertical transfer routes to said horizontal transfer route, and for alternatively selecting and vertically transferring a next one-row portion of said signal charges to said horizontal transfer route.

2. A solid-state image pickup device as claimed in claim 1, wherein an exhaust drain is connected to said solid-state image pickup device through a gate located at the end of said vertical transfer routes opposite to said horizontal transfer route.

3. A solid-state image pickup device as claimed in claim 2, wherein unwanted electrical charges are expelled through said exhaust drain.

4. A solid-state image pickup device as claimed in claim 1, wherein said signal charages are read to an external device through said horizontal transfer route.

5. A solid-state image pickup device as claimed in claim 1, wherein a vertical charge-coupled device forms said vertical transfer routes and wherein a horizontal charge-coupled device forms said horizontal transfer route.

6. A solid-state image pickup device as claimed in claim 4, wherein a vertical charge-coupled device forms said vertical transfer routes and wherein a horizontal charge-coupled device forms said horizontal transfer route.

* * * * *